United States Patent
Na et al.

(10) Patent No.: US 8,592,989 B2
(45) Date of Patent: Nov. 26, 2013

(54) INTEGRATED CIRCUIT PACKAGE SYSTEM WITH BUMP OVER VIA

(75) Inventors: Guichea Na, Ichon-si (KR); Soohan Park, Yongin-si (KR); Gwangjin Kim, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 539 days.

(21) Appl. No.: 11/673,558

(22) Filed: Feb. 9, 2007

(65) Prior Publication Data

US 2008/0191345 A1    Aug. 14, 2008

(51) Int. Cl.
*H01L 23/48* (2006.01)

(52) U.S. Cl.
USPC ............ 257/774; 257/781; 257/E21.011; 257/E23.145; 438/637; 438/638

(58) Field of Classification Search
USPC ........... 257/774, E21.577, E21.585, E21.586, 257/E23.067, E23.011; 438/637, 638
See application file for complete search history.

(56) References Cited

U.S. PATENT DOCUMENTS

| | | | |
|---|---|---|---|
| 6,392,163 B1 | 5/2002 | Rinne et al. | |
| 6,551,856 B1 | 4/2003 | Lee | |
| 6,809,020 B2 | 10/2004 | Sakurai et al. | |
| 2005/0248002 A1* | 11/2005 | Newman et al. | 257/621 |
| 2006/0216860 A1* | 9/2006 | Pendse | 438/108 |

OTHER PUBLICATIONS

Definition of "elongate" or "elongated", Webster's Ninth New Collegiate Dictionary, 1989, p. 404, Merriam-Webster Inc., Springfield, Massachusetts, U.S.A.

* cited by examiner

*Primary Examiner* — Eva Yan Montalvo
(74) *Attorney, Agent, or Firm* — Ishimaru & Associates LLP

(57) ABSTRACT

An integrated circuit package system includes a substrate, forming a resist layer having an elongated recess over the substrate, forming a via in the substrate below the elongated recess, and forming an elongated bump in the elongated recess over the via.

20 Claims, 4 Drawing Sheets

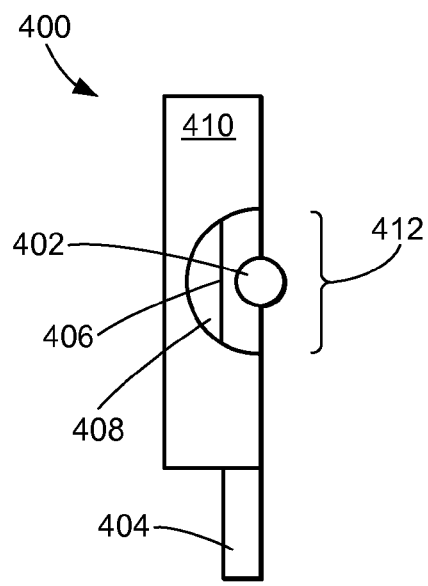
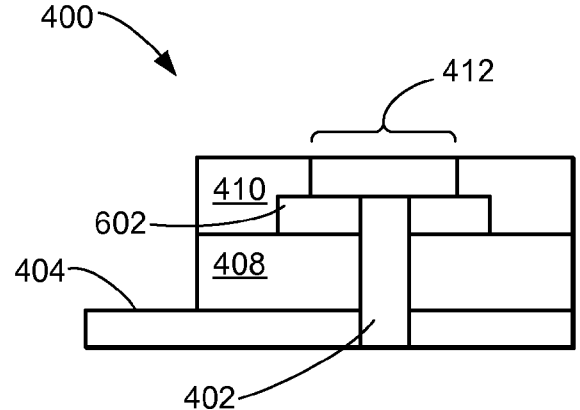
FIG. 5
FIG. 6
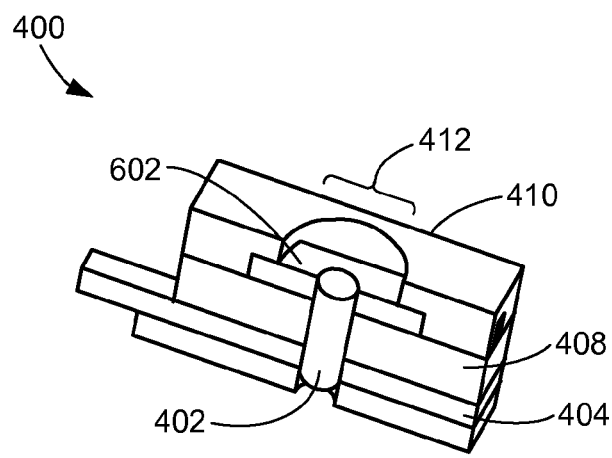
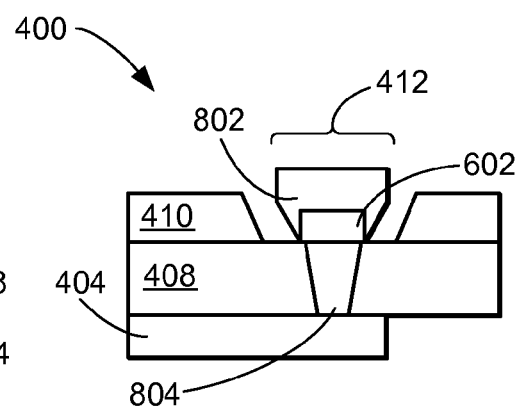
FIG. 7
FIG. 8

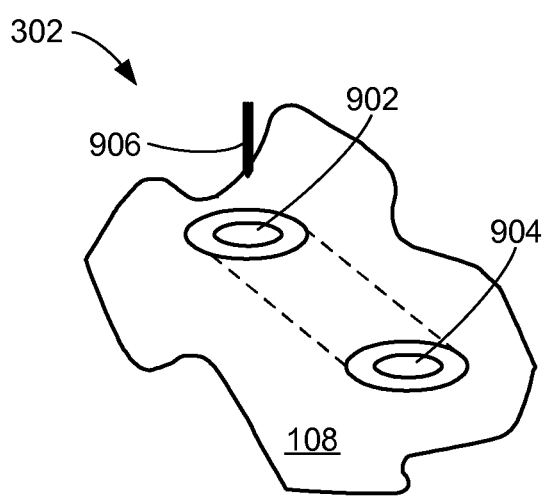
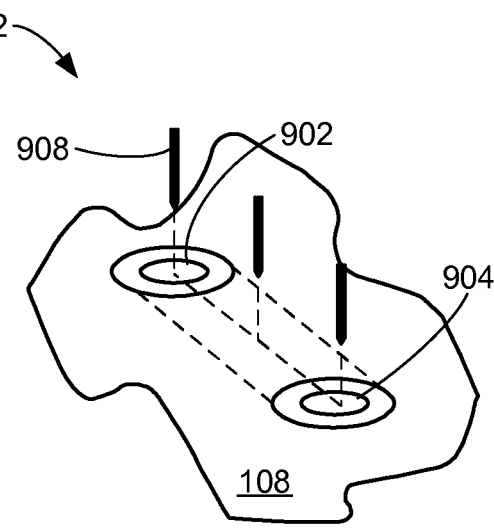
FIG. 9A                FIG. 9B
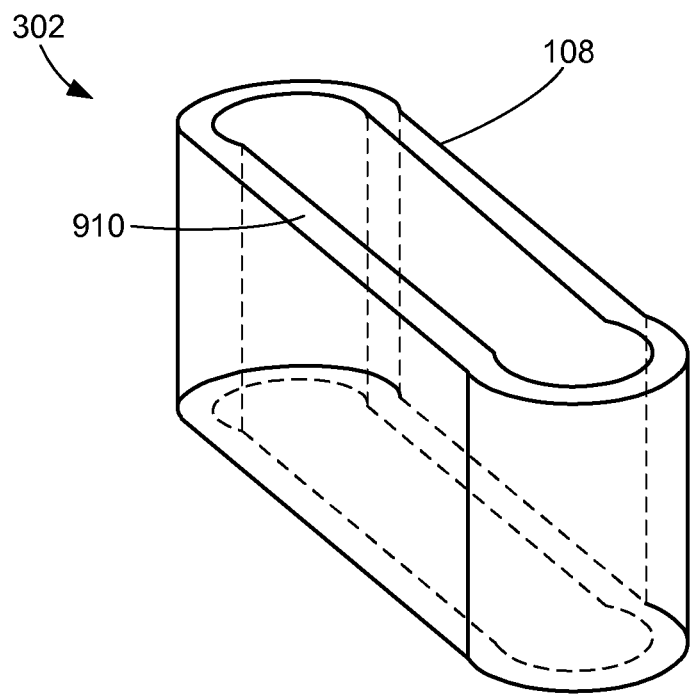
FIG. 9C

INTEGRATED CIRCUIT PACKAGE SYSTEM WITH BUMP OVER VIA

TECHNICAL FIELD

The present invention relates generally to integrated circuit package systems, and more particularly to a system for integrated circuit packages with pads.

BACKGROUND ART

The demand for smaller, higher performance semiconductor dice which support portable communications devices, including memory cards, smart cards, cellular telephones, and portable computing and gaming devices, has motivated the development of new techniques for producing smaller and thinner semiconductor devices.

Flip-chip packaging technology has found widespread use because of its advantage in size, performance, flexibility, reliability and cost over other packaging methods. Flip chip packaging employs direct electrical connection of face-down integrated circuit (IC) chips onto substrates, circuit boards, or carriers, by means of conductive bumps on the chip bond pads, replacing older wire bonding technology where face-up chips sit on substrates with wire connection to each bond pad.

Many of the flip-chip bumping techniques developed in recent years have focused on realizing bumps or solderable metallizations directly on the peripheral bond pads of a semiconductor chip. Solder bumping by screen printing solder paste can be used for chip I/O pitches down to 200 micron. However, with increasing IC complexity, the IC pin count has also increased drastically, so that if only peripheral pads were used, pitches that are less than 60 micron would be necessary. Therefore, in order to package these IC chips using flip-chip technology, the peripheral I/O pads are usually redistributed into area array pads with larger pads and a relaxed pitch. Such redistribution is typically accomplished by physically connecting the peripheral pads to the area array pads using conducting leads formed on the semiconductor chip.

Redistribution of I/O pads for flip chip packaging typically involves several process steps such as: bumping of peripheral bond pads; spinning of dielectric layer; photo imaging for opening of bond pads; formation of seed layer; full area metal deposition; photo masking for defining the redistribution lines; metal etching; spinning of solder masks and photo imaging for opening of redistributed pads; bumping of redistributed pads; and solder stencil printing.

During flip chip packaging, the IC chip with bump array can be placed facedown on a substrate with a matching bump array, and the assembly is heated to make a solder connection. The solder bumps in the matching bump array on the substrate are routed to a ball grid array (BGA) attached to the substrate via connection lines in the substrate. With the increasing density of the bump array, customized substrates with multi-layered routing are typically used for today's flip chip ICs in order to fan-out all traces of the connection lines.

The bump arrays are placed on matching bump pads on a top side of the substrate. The matching bump pads are then connected to substrate BGA pads for attaching the BGA on a bottom side of the substrate via six layers of routing lines and vias that couple between these layers. The substrate unit cost increases drastically due to the additional layer count and advanced design rules to lay out the substrate routing lines. Therefore, there is a need to reduce substrate unit cost by using standard or semi-standard substrates with fewer routing layers and less stringent design rules.

As is well known in the field of integrated circuit packaging, flip-chip mounting provides smaller footprint and lower manufacturing cost. However, processing methods and materials can prevent further improvements in size and numbers of bump pads and routing lines. Further, additional routing layers and vias adversely affect electrical integrity and performance. To date, integrated circuit packages have not successfully addressed manufacturing, yield and performance issues. A new approach must be found in order to increase the manufacturing and performance of integrated circuit packages.

Thus, a need still remains for an integrated circuit package system to improve routing lines and vias while maintaining electrical integrity and performance. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a substrate, forming a resist layer having an elongated recess over the substrate, forming a via in the substrate below the elongated recess, and forming an elongated bump in the elongated recess over the via.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

FIG. 5 is a top plan view of the integrated circuit package system in the via forming phase;

FIG. 6 is a cross-sectional view of the structure of FIG. 5 in the via forming phase;

FIG. 7 is an isometric view of the structure of FIG. 6 in the via forming phase;

FIG. 8 is a cross-sectional view of the structure of FIG. 7 in a bump forming phase;

FIGS. 9A, 9B and 9C, are isometric views of the elongated via in forming phases as examples of an embodiment of the present invention;

BEST MODE FOR CARRYING OUT THE INVENTION

Figure 1:
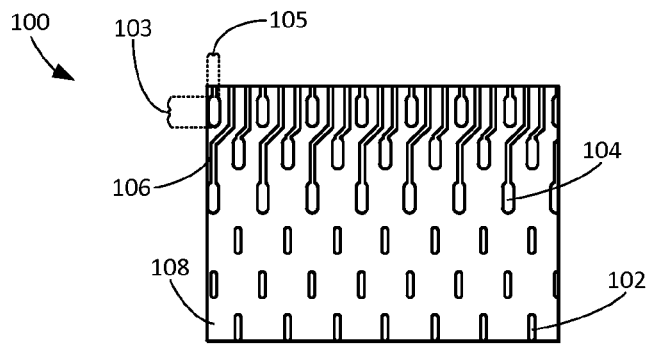
FIG. 1 is a plan view of an integrated circuit package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is shown a plan view of an integrated circuit package system 100 in an embodiment of the present invention. The integrated circuit package system 100 includes an elongated bump pad over via 102 and a top layer elongated bump pad 104, each having a rounded, elongated shape with a top length 103 greater than a top width 105. Top layer traces 106 can be formed with the top layer elongated bump pad 104. The elongated bump pad over via 102 is formed over electrical connections to lower layer conductors. The elongated bump pad over via 102 and the top layer elongated bump pad 104 are formed over a dielectric layer 108.

Figure 2:
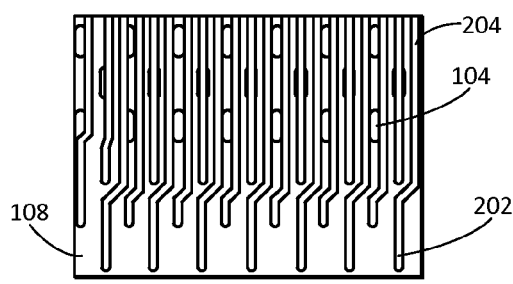
FIG. 2 is a plan view of the integrated circuit package system with a lower layer.

Referring now to FIG. 2, therein is shown a plan view of the integrated circuit package system 100 with a lower layer. The integrated circuit package system 100 includes lower layer pads 202 and lower layer traces 204, such as lower layer conductors. The lower layer traces 204 can extend the lower layer pads 202 to provide increased routable and extractable traces over the dielectric layer 108. The lower layer pads 202 provide electrical connectivity to the elongated bump pad over via 102 of FIG. 1.

For illustrative purposes the six rows having the lower layer pads 202 or the top layer elongated bump pad 104 are shown, although it is understood that any number of rows may be formed. Further, for illustrative purposes, two of the lower layer traces 204 are shown between two adjacent of the top layer elongated bump pad 104, although it is understood that any number of the lower layer traces 204 may be formed.

Figure 3:
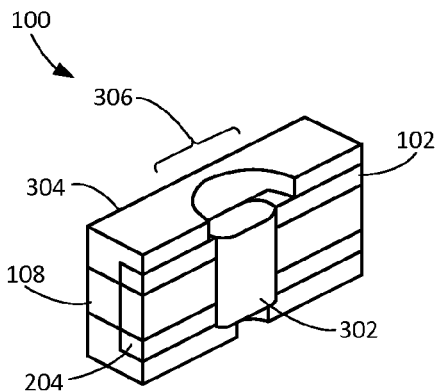
FIG. 3 is an isometric view of the integrated circuit package system in a via forming phase.

Referring now to FIG. 3, therein is shown an isometric view of the integrated circuit package system 100 in a via forming phase. The integrated circuit package system 100 includes an elongated via 302, the lower layer traces 204, the elongated bump pad over via 102, and the dielectric layer 108. The elongated via 302 is formed between the lower layer traces 204 and the elongated bump pad over via 102 to provide electrical connectivity over the dielectric layer 108. A resist layer 304, such as a solder resist layer, is formed over the dielectric layer 108 and the elongated bump pad over via 102 and the top layer traces 106 of FIG. 1. The resist layer 304 includes an elongated recess 306. The elongated recess 306 can be formed in the resist layer 304 over the elongated via 302.

An aspect of the embodiments is that the present invention improves electrical properties when bumps are arrayed with a fine pitch. As an example, flip-chips arrayed with finer pitches require a change to via pads to increase residual bump connections beyond lead bumps. Without adding layer count, bond on lead is replaced with a new via structure, such as the elongated via 302.

Figure 4:
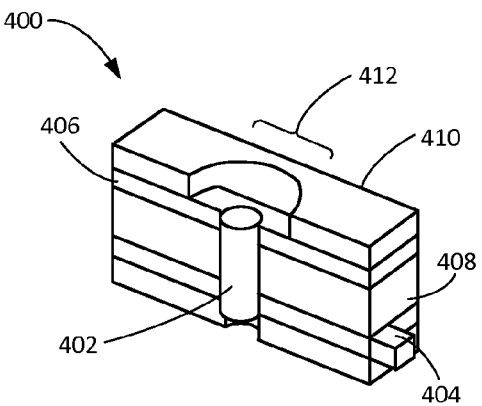
FIG. 4 is an isometric view of an integrated circuit package system in a via forming phase in an alternative embodiment of the present invention.

Referring now to FIG. 4 therein is shown an isometric view of an integrated circuit package system 400 in a via forming phase in an alternative embodiment of the present invention. In a manner similar to the integrated circuit package system 100, the integrated circuit package system 400 includes a single via 402, lower layer traces 404, a top layer trace 406, and a dielectric layer 408. The single via 402 is formed between and in the lower layer traces 404 and the top layer trace 406 to provide electrical connectivity over the dielectric layer 408. A resist layer 410, such as a solder resist layer, is formed over the dielectric layer 408 and the top layer trace 406 and top layer traces. The resist layer 410 includes an elongated recess 412. The elongated recess 412 can be formed in the resist layer 410 over the single via 402.

Referring now to FIG. 5, therein is shown a top plan view of the integrated circuit package system 400 in the via forming phase. The integrated circuit package system 400 includes the single via 402, the lower layer traces 404, the top layer trace 406, and the dielectric layer 408. The single via 402 is formed between the lower layer traces 404 and the top layer trace 406 to provide electrical connectivity over the dielectric layer 408. The resist layer 410 is formed over the dielectric layer 408 and the top layer trace 406 and top layer traces. The resist layer 410 includes the elongated recess 412. The elongated recess 412 can be formed in the resist layer 410 over the single via 402.

Referring now to FIG. 6, therein is shown a cross-sectional view of the structure of FIG. 5 in the via forming phase. The integrated circuit package system 400 includes an elongated bump pad over via 602, the single via 402, the lower layer traces 404, and the dielectric layer 408. The single via 402 is formed between the lower layer traces 404 and the elongated bump pad over via 602 to provide electrical connectivity over the dielectric layer 408. The resist layer 410 is formed over the dielectric layer 408 and the elongated bump pad over via 602 and top layer traces. The resist layer 410 includes the elongated recess 412. The elongated recess 412 can be formed in the resist layer 410 over the single via 402.

Referring now to FIG. 7, therein is shown an isometric view of the structure of FIG. 6 in the via forming phase. The integrated circuit package system 400 includes the elongated bump pad over via 602, the single via 402, the lower layer traces 404, and the dielectric layer 408. The single via 402 is formed between the lower layer traces 404 and the elongated bump pad over via 602 to provide electrical connectivity over the dielectric layer 408. The resist layer 410 is formed over the dielectric layer 408 and the elongated bump pad over via 602 and top layer traces. The resist layer 410 includes the elongated recess 412. The elongated recess 412 can be formed in the resist layer 410 over the single via 402.

Referring now to FIG. 8, therein is shown a cross-sectional view of the structure of FIG. 7 in a bump forming phase. The integrated circuit package system 400 includes an elongated bump 802, such as a solder bump over the elongated bump pad over via 602, a single via 804, such as a laser via formed having a tapered shape, the dielectric layer 408, and the lower layer traces 404. The elongated bump 802 is formed in the elongated recess 412 of the resist layer 410. Space between the elongated bump 802 and the resist layer 410 can be provided for processing such as preventing overlap of the resist layer 410, forming traces (not shown), forming smaller bump pitches. The elongated bump 802 is electrically connected to the single via 804, formed between the lower layer traces 404 and the elongated bump pad over via 602, to provide electrical connectivity over the dielectric layer 408.

For illustrative purposes the integrated circuit package system 400 is shown having a space between the elongated bump 802 and the resist layer 410 although it is understood that the integrated circuit package system 400 may have the elongated bump 802 adjacent to the resist layer 410. Further, for illustrative purposes, the single via 804 is shown having a tapered shape although it is understood that the single via 804 may have other shapes.

Referring now to FIGS. 9A, 9B and 9C, therein are shown isometric views of the elongated via 302 in forming phases as examples of an embodiment of the present invention. The elongated via 302 can be formed with a first via recess 902 and a second via recess 904. A first apparatus 906, such as a drill, can be applied to the dielectric layer 108 to form the elongated via 302. The first via recess 902 and the second via recess 904 are formed in the dielectric layer 108 by the first apparatus 906 using a process, such as drilling. A second apparatus 908 can apply a process, such as routing or burning, to form an elongated opening in the dielectric layer 108. A conductive material 910 can be applied by a process, such as filling or plating, to the elongated via 302. The process provides electrical conductivity to the elongated via 302 for connecting the elongated bump pad over via 102 of FIG. 1 to the lower layer traces 204 of FIG. 2.

Figure 10A:
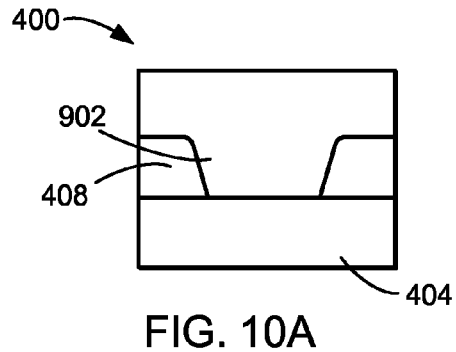
FIGS. 10A and 10B are a cross-sectional view and an isometric view of the integrated circuit package system in a via forming phase.
Figure 10B:
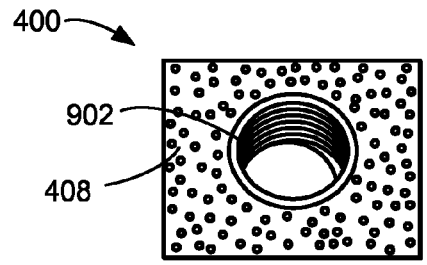

Referring now to FIG. 10A and FIG. 10B, therein are shown a cross-sectional view and an isometric view of the integrated circuit package system 400 in a via forming phase. The first via recess 902 can be formed in the dielectric layer 408 by a process, such as drilling. The first via recess 902 can provide electrical connectivity between the lower layer traces 404 and the top layer trace 406 of FIG. 4. In a similar manner, the second via recess 904 of FIG. 9 can be formed in the dielectric layer 108 of FIG. 1.

Figure 11A:
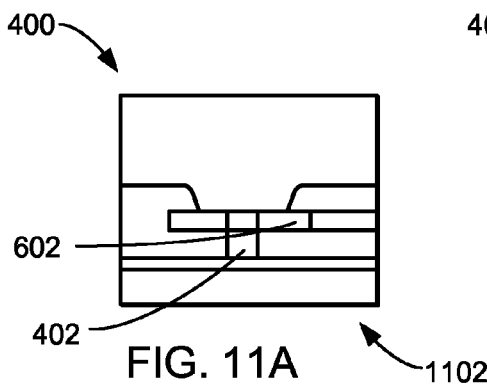
FIGS. 11A and 11B therein are shown cross-sectional views of the integrated circuit package system in a bump preparation phase and a bump formation phase.
Figure 11B:
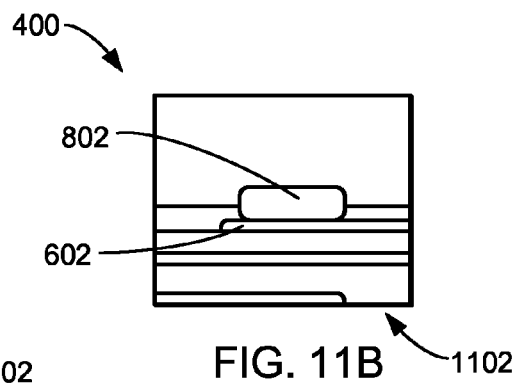

Referring now to FIGS. 11A and 11B, therein are shown cross-sectional views of the integrated circuit package system 400 in a bump preparation phase and a bump formation phase. The integrated circuit package system 400 includes the elongated bump 802 over the elongated bump pad over via 602 and the single via 402. The single via 402 is formed through a substrate 1102. The substrate 1102 can include several layers, such as conductive layers or the dielectric layer 408 of FIG. 4. The elongated bump 802 provides electrical connectivity to layers within the substrate 1102 through the single via 402.

It has been discovered that the elongated bump 802 provides improved electrical properties with increased extended rows of bumps.

Figure 12:
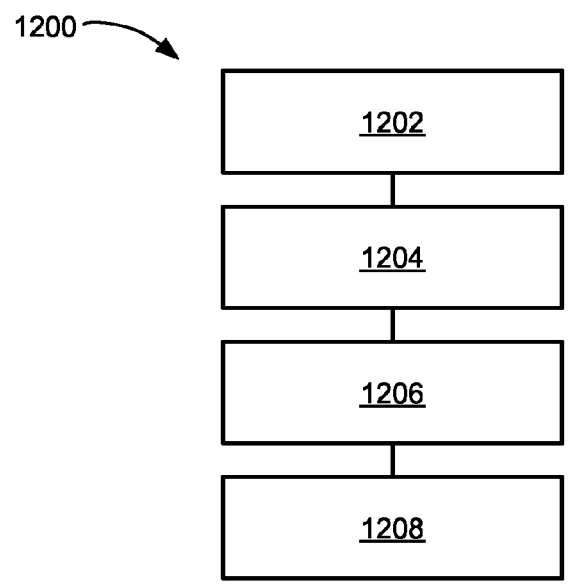
FIG. 12 is a flow chart of an integrated circuit package system for manufacturing the integrated circuit package system in an embodiment of the present invention.

Referring now to FIG. 12, therein is shown a flow chart of an integrated circuit package system 1200 for manufacturing the integrated circuit package system 100 in an embodiment of the present invention. The system 1200 includes providing a substrate in a block 1202; forming a resist layer having an elongated recess over the substrate in a block 1204; forming a via in the substrate below the elongated recess in a block 1206; and forming an elongated bump in the elongated recess over the via in a block 1208.

In greater detail, a system to provide the method and apparatus of the integrated circuit package system 100, in an embodiment of the present invention, is performed as follows:

1. Providing a substrate having a lower layer trace.
2. Forming a resist layer having an elongated recess over the lower layer trace.
3. Forming a via in the substrate below the elongated recess and over the lower layer trace.
4. Applying a conductive material over the via.
5. Forming an elongated bump in the elongated recess over the via and the lower trace.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacture of an integrated circuit package system comprising:
   providing a substrate having a lower layer trace;
   forming a resist layer having an elongated recess over the substrate;
   forming a via in the substrate below the elongated recess and in the lower layer trace; and
   forming an elongated bump pad in the elongated recess over the via, the elongated bump pad having a rounded, elongated shape with a top length greater than a top width.

2. The method as claimed in claim 1 wherein forming the via includes forming an elongated via.

3. The method as claimed in claim 1 wherein forming the via includes forming a single via.

4. The method as claimed in claim 1 wherein forming the via includes plating the via.

5. The method as claimed in claim 1 wherein forming the via includes filling the via.

6. A method of manufacture of an integrated circuit package system comprising:

providing a substrate having a lower layer trace and a top layer trace;

forming a resist layer having an elongated recess over the lower layer trace;

forming a via in the substrate below the elongated recess in the lower layer trace and in the top layer trace;

applying a conductive material over the via; and forming an elongated bump pad in the elongated recess over the via and the lower layer trace, the elongated bump pad having a rounded, elongated shape with a top length greater than a top width.

7. The method as claimed in claim 6 wherein forming the via includes forming an elongated via in a dielectric layer.

8. The method as claimed in claim 6 wherein forming the via includes forming a single via in a dielectric layer.

9. The method as claimed in claim 6 wherein applying the conductive material includes plating the via with the conductive material.

10. The method as claimed in claim 6 wherein applying the conductive material includes filling the via with the conductive material.

11. An integrated circuit package system comprising:
a substrate having a lower layer trace;
a resist layer having an elongated recess over the substrate;
a via in the substrate below the elongated recess and in the lower layer trace; and
an elongated bump pad in the elongated recess over the via, the elongated bump pad having a rounded, elongated shape with a top length greater than a top width.

12. The system as claimed in claim 11 wherein the via is an elongated via.

13. The system as claimed in claim 11 wherein the via is a single via.

14. The system as claimed in claim 11 wherein the via is the via plated.

15. The system as claimed in claim 11 wherein via is the via filled.

16. The system as claimed in claim 11 wherein:
the substrate has a top layer trace;
the resist layer has the elongated recess over the top layer trace;
the via is in the substrate below the elongated recess in the lower layer trace and in the top layer trace;
the elongated bump is in the elongated recess over the via and the lower trace; and
further comprising:
applying a conductive material over the via.

17. The system as claimed in claim 16 wherein the via is an elongated via in a dielectric layer.

18. The system as claimed in claim 16 wherein the via is a single via in a dielectric layer.

19. The system as claimed in claim 16 wherein the conductive material includes the via plated with the conductive material.

20. The system as claimed in claim 16 wherein the conductive material includes the via filled with the conductive material.

* * * * *